United States Patent
Kondou et al.

(10) Patent No.: US 10,444,041 B2
(45) Date of Patent: Oct. 15, 2019

(54) ENCODER HAVING FUNCTION OF ADJUSTING THRESHOLD VALUE OF COMPARATOR AND METHOD FOR CONTROLLING ENCODER

(71) Applicant: FANUC CORPORATION, Minamitsuru-gun, Yamanashi (JP)

(72) Inventors: Youhei Kondou, Yamanashi (JP); Keisuke Imai, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/003,638

(22) Filed: Jun. 8, 2018

(65) Prior Publication Data

US 2018/0356260 A1  Dec. 13, 2018

(30) Foreign Application Priority Data

Jun. 13, 2017  (JP) .................................. 2017-115902

(51) Int. Cl.
*G01D 5/34* (2006.01)
*H03K 5/24* (2006.01)
(Continued)

(52) U.S. Cl.
CPC ............ *G01D 5/34* (2013.01); *G01D 5/24476* (2013.01); *H03K 5/24* (2013.01); *G01D 5/347* (2013.01)

(58) Field of Classification Search
CPC .......... G01D 5/34; G01D 5/341; G01D 5/342; G01D 5/347; G01D 5/3473; G01D 5/36;
(Continued)

(56) References Cited

U.S. PATENT DOCUMENTS 4,498,040 A * 2/1985 Tatsushi ........... G01R 19/16571
257/E27.06
4,914,387 A  4/1990 Santos
(Continued)

FOREIGN PATENT DOCUMENTS

CN  1037380 A  11/1989
CN  1992508 A  7/2007
(Continued)

*Primary Examiner* — John R Lee
(74) *Attorney, Agent, or Firm* — RatnerPrestia

(57) ABSTRACT

An encoder according to an embodiment of this disclosure includes a voltage generation circuit connected to a power supply through a diode and having a variable resistor, the voltage generation circuit outputting a voltage corresponding to a current flowing through the diode and a resistance value of the variable resistor, as a threshold value; a comparator for comparing an analog signal inputted from a detector for detecting rotation of a motor with the threshold value inputted from the voltage generation circuit, and outputting a comparison result as a comparator output; an A/D converter for converting the analog signal into a digital signal; a threshold value determination circuit for calculating a new threshold value using the digital signal; and a resistance value change circuit for changing a resistance value of the variable resistor, such that the calculated new threshold value is inputted from the voltage generation circuit to the comparator.

8 Claims, 9 Drawing Sheets

(51) Int. Cl.
*G01D 5/244* (2006.01)
*G01D 5/347* (2006.01)

(58) Field of Classification Search
CPC ........... G01D 5/24428; G01D 5/24452; G01D 5/24457; G01D 5/24466; G01D 5/14; G01D 5/244; G01D 5/24476; G01D 5/245; G01D 5/34707; H03K 5/24; H03K 5/086; G01R 19/165; G01R 19/16566; G01R 19/30
See application file for complete search history.

(56) References Cited

U.S. PATENT DOCUMENTS

| | | | |
|---|---|---|---|
| 5,644,127 A | 7/1997 | Ohmae | |
| 5,893,049 A * | 4/1999 | Reggiardo | A61B 5/053 702/193 |
| 5,898,170 A | 4/1999 | Featherston et al. | |
| 6,518,910 B2 * | 2/2003 | Sakuragi | H03M 1/1225 341/118 |
| 7,012,397 B2 | 3/2006 | Taniguchi et al. | |
| 8,054,093 B2 | 11/2011 | Yoshioka | |
| 8,841,600 B2 | 9/2014 | Thor et al. | |
| 2007/0278392 A1 * | 12/2007 | Toh | H03M 1/26 250/231.13 |
| 2012/0053433 A1 * | 3/2012 | Chamoun | A61B 5/0205 600/324 |
| 2012/0104236 A1 | 5/2012 | Thor et al. | |
| 2014/0117212 A1 * | 5/2014 | Imai | H03F 3/087 250/208.2 |
| 2014/0217934 A1 * | 8/2014 | Suzuki | H02P 7/285 318/139 |
| 2016/0146875 A1 | 5/2016 | Rajczewski et al. | |
| 2016/0252375 A1 | 9/2016 | Kikuchi et al. | |
| 2018/0183228 A1 * | 6/2018 | Huber | G01R 19/165 |
| 2018/0356257 A1 * | 12/2018 | Kondou | G01D 5/24428 |
| 2018/0356260 A1 * | 12/2018 | Kondou | G01D 5/24476 |

FOREIGN PATENT DOCUMENTS

| | | |
|---|---|---|
| CN | 101548158 A | 9/2009 |
| CN | 102538849 A | 7/2012 |
| CN | 102538849 B | 1/2015 |
| CN | 109084813 A | 12/2018 |
| JP | H01282423 A | 11/1989 |
| JP | H07190810 A | 7/1995 |
| JP | H07191805 A | 7/1995 |
| JP | 2008076414 A | 4/2008 |
| JP | 2010-019676 A | 1/2010 |
| JP | 2016161343 A | 9/2016 |

\* cited by examiner

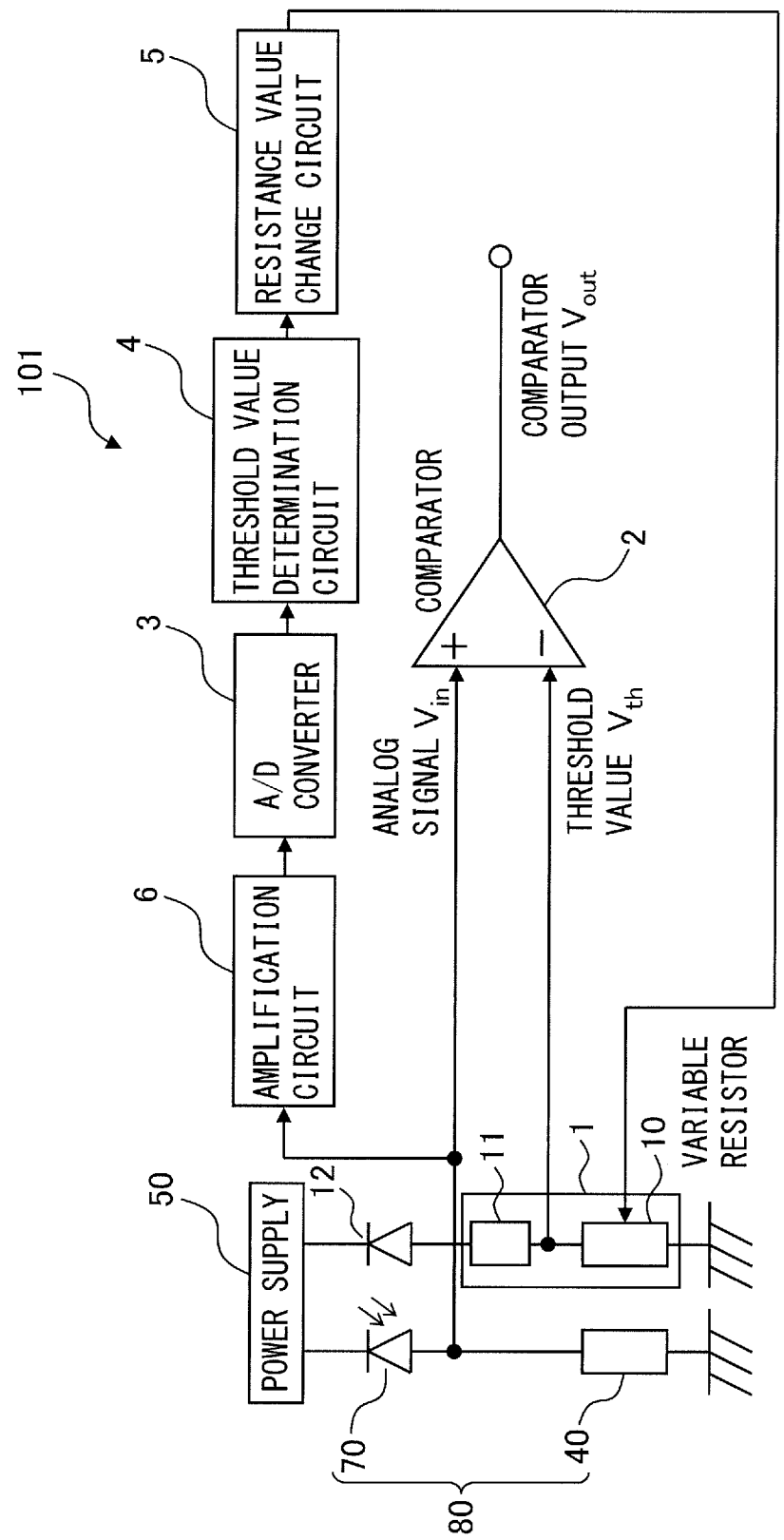

ANALOG SIGNAL

DIGITAL SIGNAL

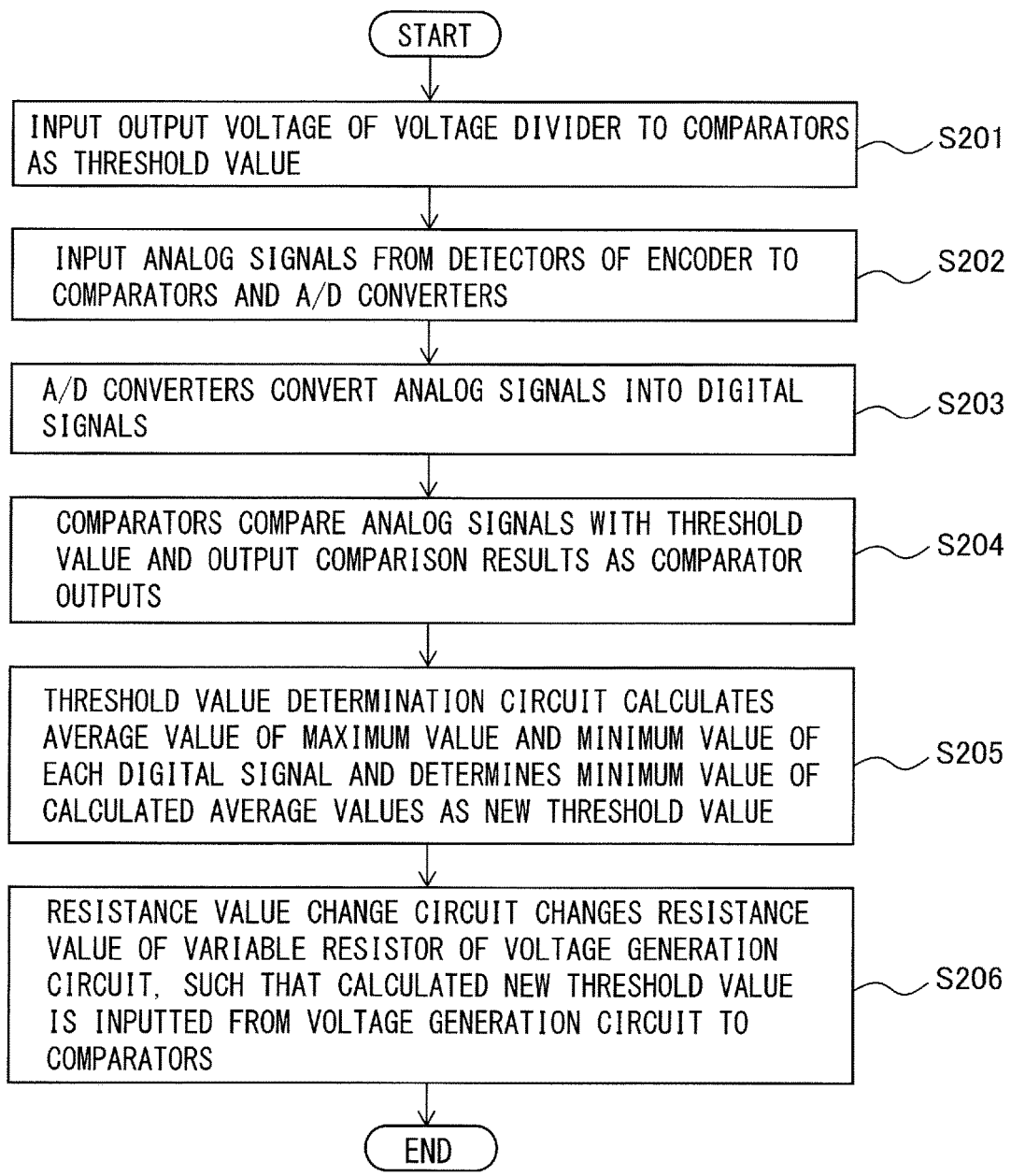

ENCODER HAVING FUNCTION OF ADJUSTING THRESHOLD VALUE OF COMPARATOR AND METHOD FOR CONTROLLING ENCODER

This application is a new U.S. patent application that claims benefit of JP 2017-115902 filed on Jun. 13, 2017, the content of 2017-115902 is incorporated herein by reference.

BACKGROUND OF THE INVENTION

1. Field of the Invention

The present invention relates to an encoder having the function of adjusting a threshold value of a comparator used in the encoder, and a method for controlling the encoder.

2. Description of Related Art

Encoders are used for detecting movement directions, movement amounts, or angles of rotating or moving objects. In the encoder, it is sometimes necessary to adjust a signal from the encoder in order to realize position detection with high accuracy. For example, a threshold value to be used for a comparison with an analog signal of the encoder is adjusted, before shipping a product of the encoder. However, this elongates tact time, and, when the signal level varies with a lapse of time after the shipment, it is difficult to readjust the threshold value. In other words, the analog signal adjustment before the shipment, by itself, cannot deal with a reduction in the amplitude of the analog signal outputted from a detection unit, owing to aging degradation of the encoder, or the occurrence of an offset.

A comparator (comparator circuit) and an encoder that can convert a sinusoidal input signal into a rectangular wave with high accuracy, without being affected by the undulation of the input signal from a detection unit, are known (for example, Japanese Unexamined Patent Publication (Kokai) No. 2010-019676). The conventional comparator includes an input unit to which the substantially sinusoidal input signal is inputted from the detection unit, a peak value calculation unit for calculating a peak value of the substantially sinusoidal input signal inputted to the input unit, a bottom value calculation unit for calculating a bottom value of the substantially sinusoidal input signal inputted to the input unit, a threshold value calculation unit for calculating a threshold value in a range between the peak value calculated by the peak value calculation unit and the bottom value calculated by the bottom value calculation unit, and a threshold value setting unit for setting the threshold value to convert the substantially sinusoidal input signal into a rectangular wave signal.

SUMMARY OF THE INVENTION

Conventional encoders have a problem that when the level of an analog signal from a detector varies with a lapse of time after shipment, it is difficult to readjust a threshold value to be used in a comparator for a comparison with the analog signal from the detector to an optimal value.

An encoder according to an embodiment of the disclosure includes a voltage generation circuit connected to a power supply through a diode and having a variable resistor, the voltage generation circuit configured to output a voltage corresponding to a current flowing through the diode and a resistance value of the variable resistor, as a threshold value; a comparator configured to perform a comparison between an analog signal inputted from a detector for detecting rotation of a motor and the threshold value inputted from the voltage generation circuit, and output a comparison result as a comparator output; an A/D converter configured to convert the analog signal into a digital signal; a threshold value determination circuit configured to calculate a new threshold value using the digital signal; and a resistance value change circuit configured to change a resistance value of the variable resistor, such that the calculated new threshold value is inputted from the voltage generation circuit to the comparator.

An encoder according to another embodiment of the disclosure includes a voltage generation circuit connected to a power supply through a diode and having a variable resistor, the voltage generation circuit configured to output a voltage corresponding to a current flowing through the diode and a resistance value of the variable resistor, as a threshold value; a plurality of comparators configured to perform comparisons between each of analog signals inputted from detectors for detecting rotation of motors and the threshold value inputted from the voltage generation circuit, and output comparison results as comparator outputs; a plurality of A/D converters configured to convert the analog signals into digital signals; a threshold value determination circuit configured to calculate a new threshold value using the digital signals; and a resistance value change circuit configured to change a resistance value of the variable resistor, such that the calculated new threshold value is inputted from the voltage generation circuit to the comparators.

A method for controlling an encoder according to an embodiment of the disclosure includes the steps of inputting an output voltage of a voltage generation circuit having a variable resistor to a comparator, as a threshold value; inputting an analog signal from a detector of an encoder to the comparator and an A/D converter; converting the analog signal into a digital signal by the A/D converter; performing a comparison between the analog signal and the threshold value, and outputting a comparison result as a comparator output by the comparator; calculating a new threshold value using the digital signal by a threshold value determination circuit; and changing a resistance value of the variable resistor of the voltage generation circuit by a resistance value change circuit, such that the calculated new threshold value is inputted from the voltage generation circuit to the comparator.

A method for controlling an encoder according to another embodiment of the disclosure includes the steps of inputting an output voltage of a voltage generation circuit having a variable resistor to a plurality of comparators, as a threshold value; inputting analog signals from a plurality of detectors of an encoder to a plurality of comparators and a plurality of A/D converters; converting the analog signals into digital signals by the A/D converters; performing comparisons between each of the analog signals and the threshold value, and outputting comparison results as comparator outputs by the comparators; calculating a new threshold value using the digital signals by a threshold value determination circuit; and changing a resistance value of the variable resistor of the voltage generation circuit by a resistance value change circuit, such that the calculated new threshold value is inputted from the voltage generation circuit to the comparators.

BRIEF DESCRIPTION OF THE DRAWINGS

The objects, features, and advantages of the present invention will be more apparent from the following description of preferred embodiments relating to the accompanying drawings. In the drawings, FIG. 1 is a block diagram of an encoder according to a first embodiment;

FIG. 8 is a flowchart of the operation of the encoder according to the second embodiment.

DETAILED DESCRIPTION OF THE INVENTION

Figure 2A:
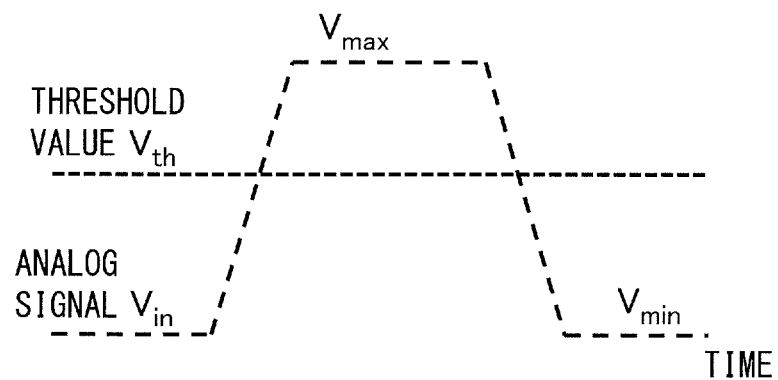
FIG. 2A is a timing chart of an analog signal inputted from a detector of the encoder to a comparator and a threshold value.

An encoder and a method for controlling the encoder according to the present invention will be described below with reference to the drawings. However, the technical scope of the present invention is not limited to the embodiments, but encompasses the invention described in claims and equivalents thereof.

An encoder according to a first embodiment will be described. FIG. 1 is a block diagram of the encoder according to the first embodiment. An encoder 101 according to the first embodiment includes a voltage generation circuit 1, a comparator 2, an A/D converter 3, a threshold value determination circuit 4, and a resistance value change circuit 5.

This embodiment uses an optical encoder, but may use a magnetic encoder instead. A detector 80 for detecting the rotation of a motor includes a light receiving element 70 and a resistor 40. The light receiving element 70 receives light from a light-emitting diode, etc., through a slit disc provided in an axis of the motor, etc., and outputs an analog signal. As the light receiving element 70, a photodiode, etc., is used. In general, two signals, i.e., an A-phase signal and a B-phase signal, are used, but this embodiment describes only one phase signal of the A-phase and B-phase signals. An analog signal $V_{in}$ detected by the detector 80 is inputted to a noninverting input terminal ("+") of the comparator 2.

The voltage generation circuit 1 is connected to a power supply 50 through a diode 12. The voltage generation circuit 1 has a variable resistor 10 and a resistor 11. The voltage generation circuit 1 outputs a voltage corresponding to a current flowing through the diode 12 and a resistance value of the variable resistor 10, as a threshold voltage (hereinafter referred to as "threshold value").

When "I" represents the current flowing through the diode, and "R" represents the resistance value of the variable resistor 10, the threshold voltage $V_{th}$ is calculated by the following equation.

$$V_{th} = I \times R$$

Therefore, varying the resistance value R of the variable resistor 10 allows for adjustment of the threshold voltage $V_{th}$. The threshold value $V_{th}$ outputted from the voltage generation circuit 1 is inputted to an inverting input terminal ("−") of the comparator 2.

Figure 2B:
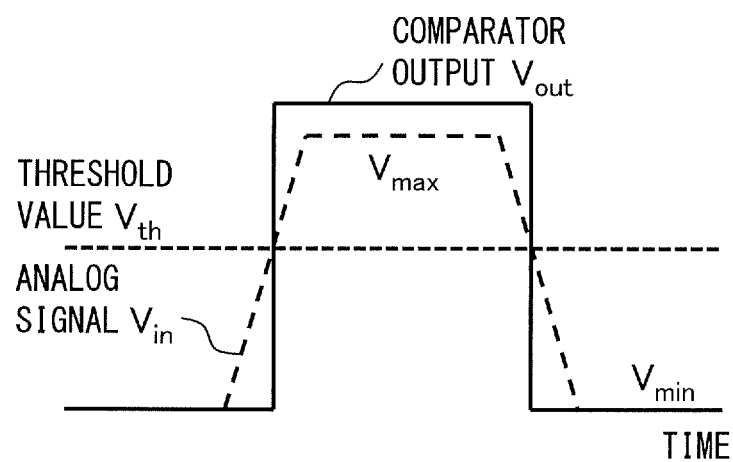
FIG. 2B is a timing chart of the analog signal inputted from the detector of the encoder to the comparator and a comparator output.

The comparator 2 performs a comparison between the analog signal $V_{in}$ inputted from the detector 80 to detect the rotation of the motor and the threshold value $V_{th}$ inputted from the voltage generation circuit 1, and outputs a comparison result as a comparator output $V_{out}$. The relationship between the analog signal $V_{in}$, the threshold value $V_{th}$, and the comparator output $V_{out}$ will be described. FIG. 2A is a timing chart of the analog signal $V_{in}$ inputted from the detector 80 of the encoder to the comparator 2 and the threshold value $V_{th}$. FIG. 2B is a timing chart of the analog signal $V_{in}$ inputted from the detector 80 of the encoder to the comparator 2 and the comparator output $V_{out}$. The comparator 2 performs a comparison between the analog signal $V_{in}$ and the threshold value $V_{th}$. When the analog signal $V_{in}$ is lower than the threshold value $V_{th}$, the comparator 2 outputs a low level signal (Low), as the comparator output $V_{out}$. On the other hand, when the analog signal $V_{in}$ is equal to or higher than the threshold value $V_{th}$, the comparator 2 outputs a high level signal (High), as the comparator output $V_{out}$. In a normal state, when an analog signal $V_{in}$ of a certain waveform is inputted, the comparator output $V_{out}$ has a rectangular waveform. In an abnormal state, on the other hand, even if the analog signal $V_{in}$ has a certain waveform, the comparator output $V_{out}$ remains at a low level or a high level. As is apparent from FIG. 2B, in order to obtain a normal comparator output $V_{out}$, the threshold value $V_{th}$ is set in a range between a minimum value $V_{min}$ and a maximum value $V_{max}$ of the analog signal $V_{in}$.

Figure 3A:
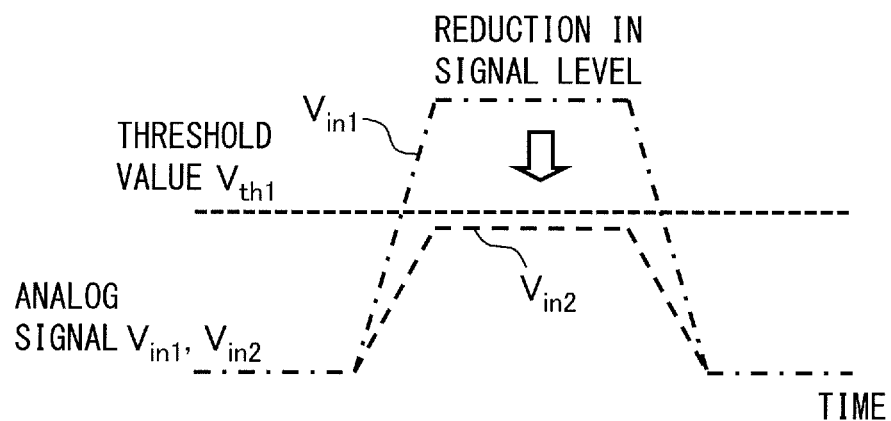
FIG. 3A is a timing chart of an analog signal inputted from the detector of the encoder to the comparator, before and after a reduction in its signal level.
Figure 3B:
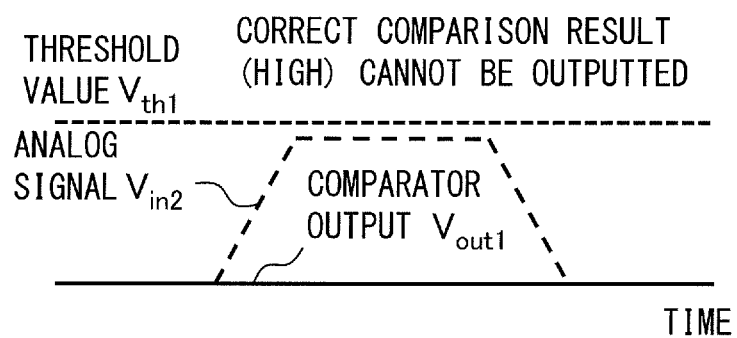
FIG. 3B is a timing chart of a comparator output, when the level of the analog signal inputted from the detector of the encoder to the comparator is lowered to less than a threshold value.

An example of an abnormal comparator output $V_{out}$ will be described. FIG. 3A is a timing chart of the analog signal $V_{in}$ inputted from the detector 80 of the encoder to the comparator 2, before and after a reduction in its signal level. FIG. 3B is a timing chart of the comparator output $V_{out}$ when the level of the analog signal $V_{in}$ inputted from the detector 80 of the encoder to the comparator 2 is lowered to less than the threshold value. As shown in FIG. 3A, the initial analog signal is indicated as $V_{in1}$, and the analog signal after aging deterioration is indicated as $V_{in2}$. Furthermore, the initial analog signal $V_{in1}$ is higher than an initial threshold value $V_{th1}$, while the analog signal $V_{in2}$ after aging deterioration is lower than the initial threshold value $V_{th1}$. In this case, after aging deterioration, the comparator output $V_{out}$ stays at a low level, in contrast to the waveform of the analog signal $V_{in2}$ after aging deterioration. As a result, the comparator 2 cannot output a correct comparison result (High). The encoder according to this embodiment aims to solve this problem, and allows for obtaining a correct comparator output, even when an analog signal varies owing to aging deterioration, etc.

Figure 4A:
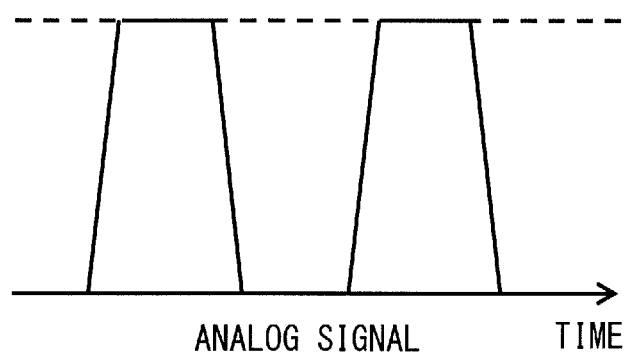
FIG. 4A is a timing chart of an analog signal inputted from the detector of the encoder to the comparator.
Figure 4B:
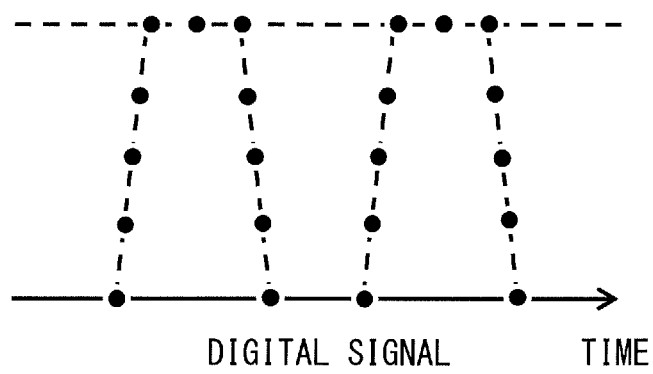
FIG. 4B is a timing chart of a digital signal converted from the analog signal to be inputted from the detector of the encoder to the comparator.

The A/D converter 3 converts the analog signal into a digital signal. The digital signal converted by the A/D converter 3 is outputted to the threshold value determination circuit 4. FIG. 4A is a timing chart of the analog signal inputted from the detector 80 of the encoder to the comparator 2. FIG. 4B is a timing chart of a digital signal converted from the analog signal inputted from the detector 80 of the encoder to the comparator 2. Converting the analog signal into the digital signal by the A/D converter 3 facilitates calculating a signal level.

An amplification circuit 6, which amplifies the amplitude of the analog signal and outputs the amplified analog signal to the A/D converter 3, may be provided to amplify the analog signal before being inputted to the A/D converter 3. The provision of the amplification circuit 6 allows the comparator 2 to output a correct comparison result, even if the analog signal is extremely weak.

Figure 4C:
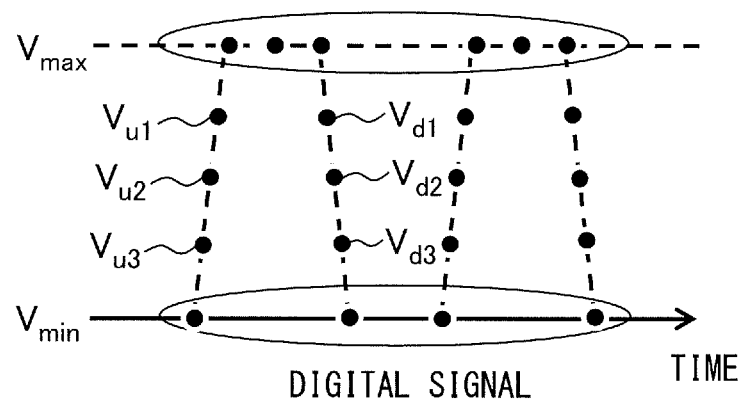
FIG. 4C is a drawing illustrating a maximum value and a minimum value of the digital signal converted from the analog signal to be inputted from the detector of the encoder to the comparator.
Figure 4D:
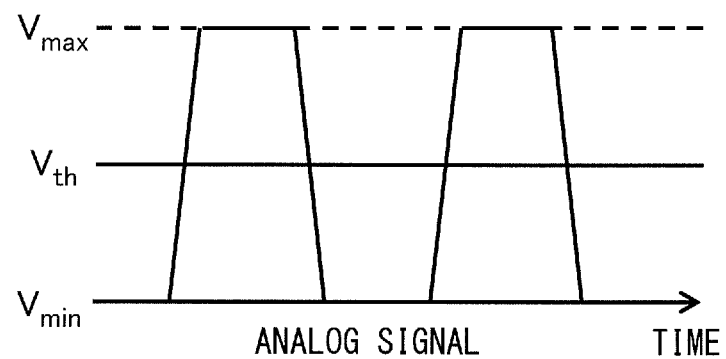
FIG. 4D is a drawing illustrating the relationship between a threshold value calculated from the maximum value and the minimum value of the digital signal and the analog signal.

The threshold value determination circuit 4 calculates a new threshold value using the digital signal. The new threshold value may be the average value of the maximum value and the minimum value of the digital signal. FIG. 4C is a drawing representing the maximum value $V_{max}$ and the minimum value $V_{min}$ of the digital signal converted from the analog signal inputted from the detector 80 of the encoder to the comparator 2. FIG. 4D is a drawing showing the relationship between the threshold value $V_{th}$ calculated from the maximum value $V_{max}$ and the minimum value $V_{min}$ of the digital signal and the analog signal. The threshold value determination circuit 4 may set the average value of the maximum value $V_{max}$ and the minimum value $V_{min}$ of the digital signal, as the new threshold value $V_{th}$. However, the present invention is not limited to this example, and any value included in the range between the maximum value $V_{max}$ and the minimum value $V_{min}$ of the digital signal may be set as the new threshold value $V_{th}$.

Figure 5A:
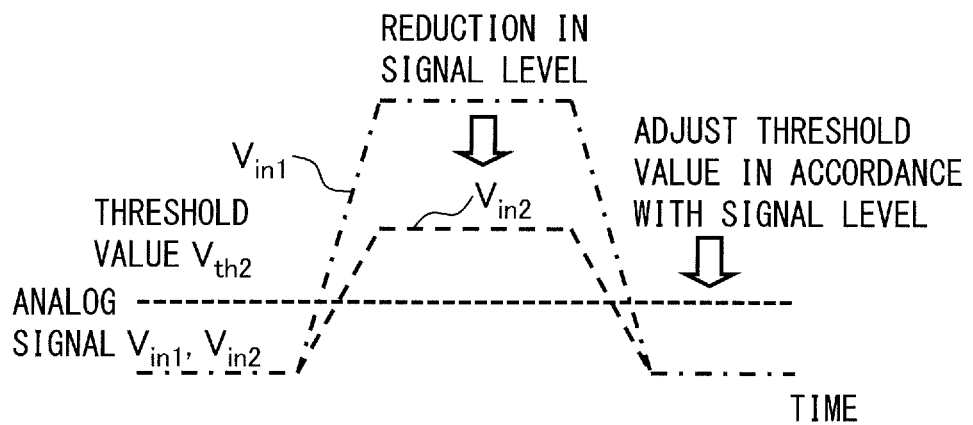
FIG. 5A is a drawing for explaining adjustment of a threshold value, when the level of an analog signal inputted from the detector of the encoder to the comparator is lowered.
Figure 5B:
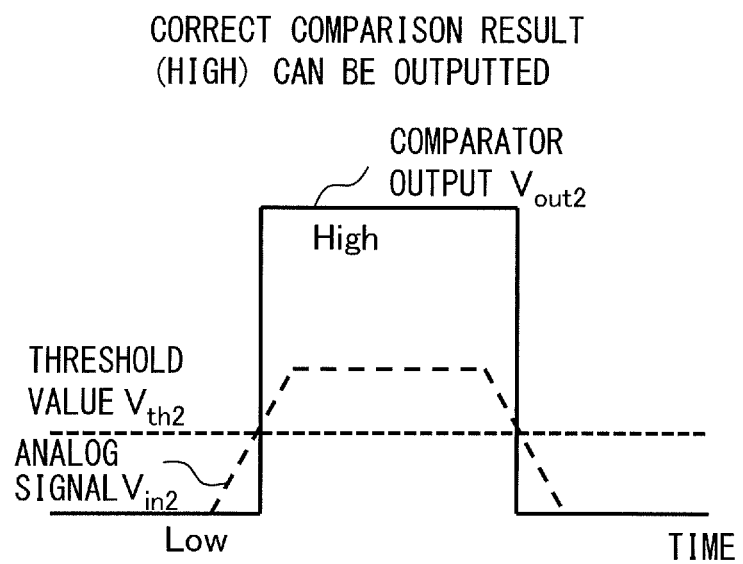
FIG. 5B is a timing chart of a comparator output after the adjustment of the threshold value, when the level of the analog signal inputted from the detector of the encoder to the comparator is lowered.

The resistance value change circuit 5 changes the resistance value of the variable resistor 10, such that a calculated new threshold value is inputted from the voltage generation circuit 1 to the comparator 2. FIG. 5A is a drawing for explaining adjustment of a threshold value, when the level of the analog signal inputted from the detector 80 of the encoder to the comparator 2 is lowered. FIG. 5B is a timing chart of a comparator output $V_{out2}$ after the adjustment of the threshold value, when the level of the analog signal inputted from the detector 80 of the encoder to the comparator 2 is lowered. For example, as described with reference to FIG. 3A, the initial analog signal $V_{in1}$ is assumed to be lowered to an analog signal $V_{in2}$, owing to aging deterioration, etc. In this case, if the analog signal $V_{in2}$ after aging deterioration is lower than the initial threshold value $V_{th1}$, a correct comparator output cannot be obtained, as described above. Thus, as shown in FIG. 5A, the threshold value determination circuit 4 and the resistance value change circuit 5 adjust the threshold value in accordance with the analog signal $V_{in2}$ after aging deterioration. For example, the average value of the maximum value and the minimum value of the analog signal $V_{in2}$ after aging deterioration may be set as a new threshold value $V_{th2}$. The comparator 2 performs a comparison between the analog signal $V_{in2}$ after aging deterioration and the new threshold value $V_{th2}$, and thus, as shown in FIG. 5B, obtains a normal comparator output $V_{out2}$ of a rectangular waveform.

Figure 6:
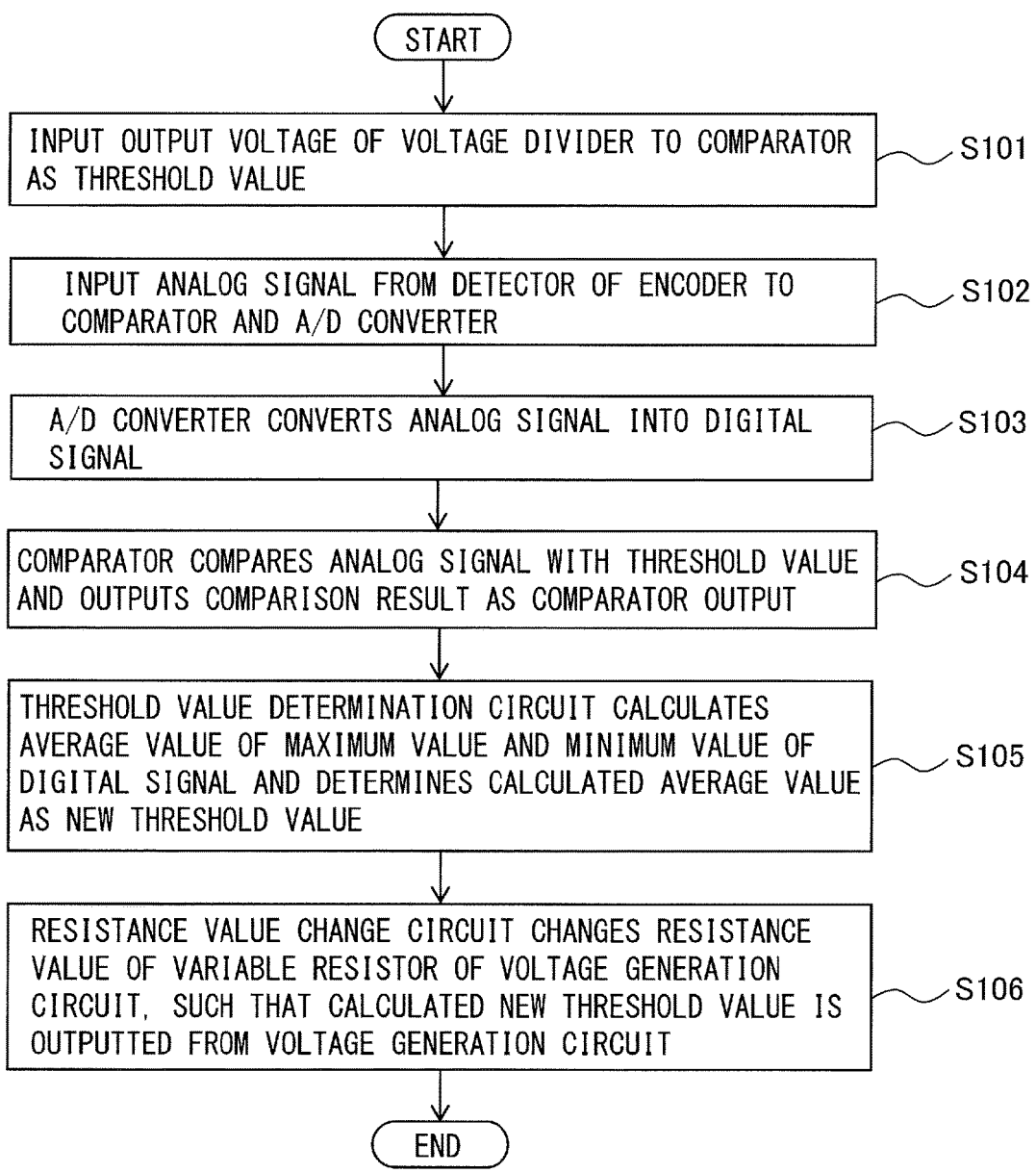
FIG. 6 is a flowchart of the operation of the encoder according to the first embodiment.

Next, a method for controlling the encoder according to the first embodiment will be described. FIG. 6 is a flowchart of the operation of the encoder according to the first embodiment. First, in step S101, an output voltage of the voltage generation circuit 1 (e.g., voltage divider) is inputted to the comparator 2, as a threshold value $V_{th}$. The threshold value $V_{th}$ is a multiplication value of the current flowing through the diode included in the voltage generation circuit 1 and the resistance value of the variable resistor 10. When the maximum value $V_{max}$ and the minimum value $V_{min}$ of the analog signal $V_{in}$ to be inputted to the comparator 2 are known, and the average value of the maximum value $V_{max}$ and the minimum value $V_{min}$ is set as the threshold value $V_{th}$, the resistance value R of the variable resistor 10 is calculated by the following equation using the current I flowing through the diode.

$$R = V_{th}/I$$
$$= (V_{max} + V_{min})/(2 \times I)$$

Next, in step S102, the analog signal $V_{in}$ is inputted from the detector 80 of the encoder to the comparator 2 and the A/D converter 3. The step of inputting the analog signal $V_{in}$ from the detector 80 of the encoder to the A/D converter 3 may further include the step of amplifying the amplitude of the analog signal $V_{in}$ by the amplification circuit 6. The amplification of the analog signal $V_{in}$ allows obtaining a normal comparator output, even if the analog signal is extremely weak.

Next, in step S103, the A/D converter 3 converts the analog signal $V_{in}$ into a digital signal. The A/D converter 3 outputs the converted digital signal to the threshold value determination circuit 4.

Next, in step S104, the comparator 2 performs a comparison between the analog signal $V_{in}$ and the threshold value $V_{th}$, and outputs the comparison result as a comparator output $V_{out}$.

Next, in step S105, the threshold value determination circuit 4 calculates the average value of the maximum value $V_{max}$ and the minimum $V_{min}$ of the digital signal, and determines the calculated average value as a new threshold value $V_{th2}$. However, the present invention is not limited to this example, and the threshold value determination circuit 4 may use another calculation method to calculate a new threshold value from the digital signal. For example, as shown in FIG. 4C, the average value of voltage values ($V_{u1}$, $V_{u2}$, and $V_{u3}$) in a monotonically increasing region of the digital signal, or the average value of voltage values ($V_{d1}$, $V_{d2}$, and $V_{d3}$) in a monotonically decreasing region of the digital signal may be set as the new threshold value $V_{th2}$.

Next, in step S106, the resistance value change circuit 5 changes the resistance value of the variable resistor 10 of the voltage generation circuit 1, such that the calculated new threshold value is inputted from the voltage generation circuit 1 to the comparator 2.

As described above, since the encoder according to the first embodiment adjusts the threshold value, which is used for the comparison with the analog signal inputted to the comparator, it is possible to obtain the normal comparator output even if the analog signal from the detector of the encoder varies owing to aging deterioration, etc.

Figure 7:
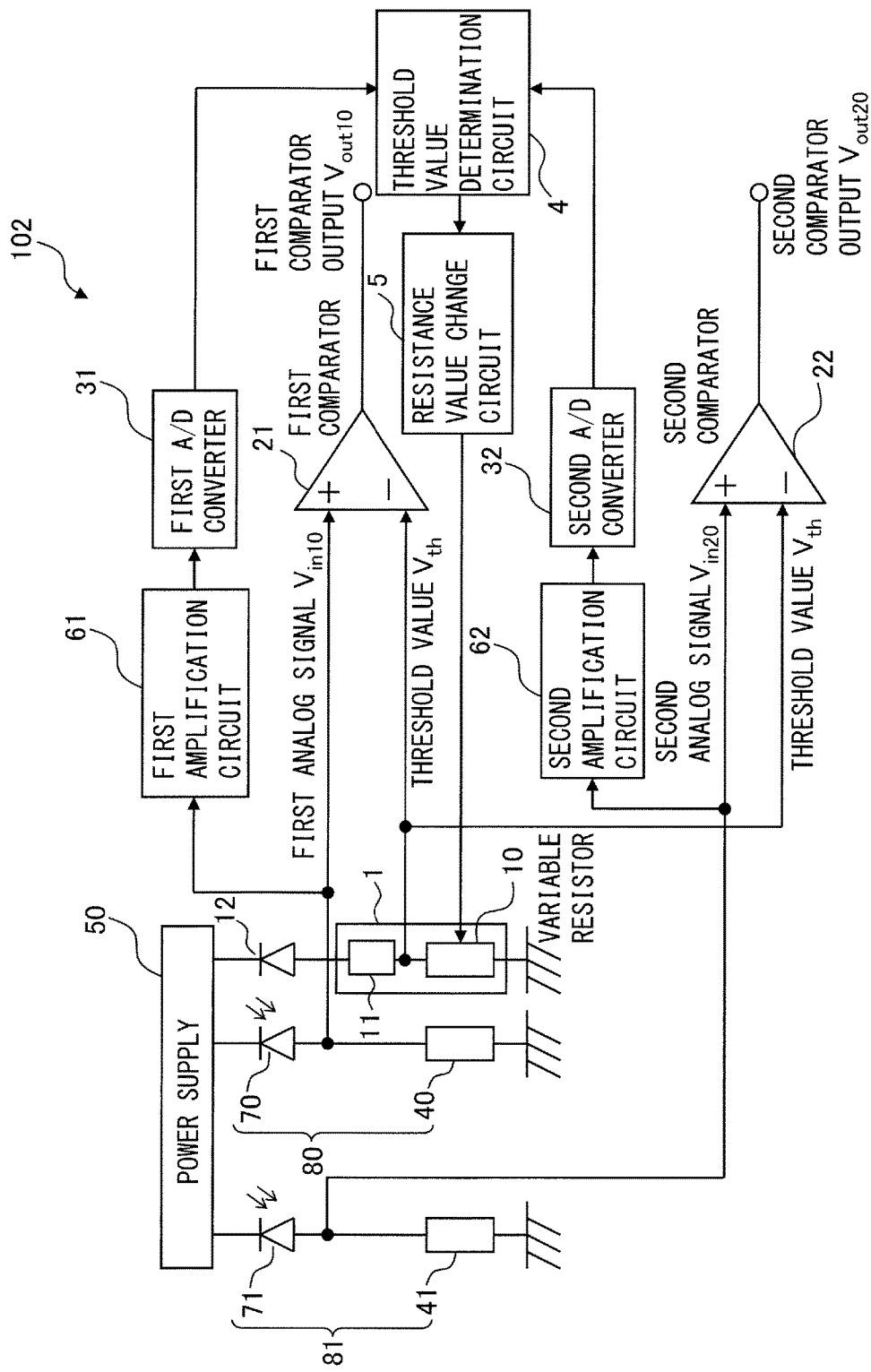
FIG. 7 is a block diagram of an encoder according to a second embodiment.

Next, an encoder according to a second embodiment will be described. FIG. 7 is a block diagram of the encoder according to the second embodiment. An encoder 102 according to the second embodiment includes a voltage generation circuit 1, a plurality of comparators (21 and 22), a plurality of A/D converters (31 and 32), a threshold value determination circuit 4, and a resistance value change circuit 5. Out of components of the encoder 102 according to the second embodiment, the same components as the components of the encoder 101 according to the first embodiment are indicated with the same reference numerals. The difference between the encoder 102 according to the second embodiment and the encoder 101 according to the first embodiment is that multiple detectors are provided to detect rotation, etc., of motors, and multiple analog signals outputted from the multiple detectors are compared by multiple comparators with a single common threshold value.

The voltage generation circuit 1 outputs a voltage corresponding to the current flowing through a diode and the resistance value of a variable resistor to an inverting input terminal ("−") of each of the first comparator 21 and the second comparator 22, as a threshold value $V_{th}$. The two comparators are used as an example of the multiple comparators, but the number of comparators may be three or more in accordance with the number of detectors.

The multiple comparators, e.g., the first comparator 21 and the second comparator 22, make comparisons between each of multiple analog signals (a first analog signal $V_{in10}$ and a second analog signal $V_{in20}$) inputted from multiple detectors (80 and 81) to detect the rotation of the motors and the threshold value $V_{th}$ inputted from the voltage generation circuit 1, and output comparison results as multiple comparator outputs (a first comparator output $V_{out10}$ and a second comparator output $V_{out20}$).

The multiple A/D converters (a first A/D converter 31 and a second A/D converter 32) convert the analog signals (the first analog signal $V_{in10}$ and the second analog signal $V_{in20}$) into digital signals. The digital signals converted by the first A/D converter 31 and the second A/D converter 32 are inputted to the threshold value determination circuit 4.

Multiple amplification circuits (a first amplification circuit 61 and a second amplification circuit 62), which amplify the amplitudes of the analog signals and output the amplified analog signals to the A/D converters (31 and 32) may be provided to amplify the analog signals before being inputted to the A/D converters (31 and 32). The provision of the amplification circuits (61 and 62) allows the comparators (21 and 22) to output correct comparison results even if the analog signals are extremely weak.

The threshold value determination circuit 4 calculates a new threshold value, using the digital signals.

The resistance value change circuit 5 changes the resistance value of the variable resistor 10, such that the calculated new threshold value is inputted from the voltage generation circuit 1 to the comparators (21 and 22).

Next, a method for controlling the encoder according to the second embodiment will be described. FIG. 8 is a flowchart of the operation of the encoder according to the second embodiment. First, in step S201, the output voltage of the voltage generation circuit 1 (e.g., voltage divider) is inputted to the comparators (21 and 22), as the threshold value $V_{th}$. The threshold value $V_{th}$ is a multiplication value of the current flowing through the diode included in the voltage generation circuit 1 and the resistance value of the variable resistor 10.

Next, in step S202, the analog signals ($V_{in10}$ and $V_{in20}$) are inputted from the detectors (80 and 81) of the encoder to the comparators (21 and 22) and the A/D converters (31 and 32), respectively. The step of inputting the analog signals ($V_{in10}$ and $V_{in20}$) from the detectors (80 and 81) of the encoder to the A/D converters (31 and 32) may further include the step of amplifying the amplitudes of the analog signals ($V_{in10}$ and $V_{in20}$) by the amplification circuits (61 and 62). The amplification of the analog signals ($V_{in10}$ and $V_{in20}$) allows for obtaining correct comparator outputs, even if the analog signals are extremely weak.

Next, in step S203, the A/D converters (31 and 32) convert the analog signals ($V_{in10}$ and $V_{in20}$) into digital signals. The A/D converters (31 and 32) output the converted digital signals to the threshold value determination circuit 4.

Next, in step S204, the comparators (21 and 22) perform comparisons between each of the analog signals ($V_{in10}$ and $V_{in20}$) and the threshold value $V_{th}$, and output the comparison results as comparator outputs (a first comparator output $V_{out10}$ and a second comparator output $V_{out20}$), respectively.

Next, in step S205, the threshold value determination circuit 4 calculates the average value of the maximum value $V_{max}$ and the minimum $V_{min}$ of each of the digital signals, and determines the minimum value of the calculated average values as a new threshold value $V_{th2}$. According to this configuration, even if the analog signal that corresponds to the minimum value of the digital signals is inputted to its corresponding comparator, a normal comparator output can be obtained. However, the present invention is not limited to this example, and the threshold value determination circuit may use another calculation method to calculate a new threshold value from the digital signals. For example, as shown in FIG. 4C, the average value of the voltage values ($V_{u1}$, $V_{u2}$, and $V_{u3}$) in a monotonically increasing region of the digital signal, or the average value of voltage values ($V_{d1}$, $V_{d2}$, and $V_{d3}$) in a monotonically decreasing region of the digital signal may be set as the new threshold value $V_{th2}$.

Next, in step S206, the resistance value change circuit 5 changes the resistance value of the variable resistor 10 of the voltage generation circuit 1, such that the calculated new threshold value is inputted from the voltage generation circuit 1 to the comparators (21 and 22).

As described above, in the encoder according to the second embodiment, even if at least one of the multiple analog signals from the detectors of the encoder varies owing to aging deterioration, etc., the threshold value to be used for comparisons with each of the analog signals inputted to the comparators is adjusted, thus allowing for obtaining the multiple normal comparator outputs.

In the encoders and the methods for controlling the encoders according to the embodiments of this disclosure, even if the level of the analog signal from the detector varies owing to aging deterioration after shipment, it is possible to readjust the threshold value to be used in the comparator for a comparison with the analog signal from the detector, to the optimal value.

What is claimed is:
1. An encoder comprising:
    a voltage generation circuit connected to a power supply through a diode and having a variable resistor, the voltage generation circuit configured to output a voltage (I×R) corresponding to a current I flowing through the diode and a resistance value R of the variable resistor, as a threshold value $V_{th}$;
    a comparator configured to perform a comparison between an analog signal inputted from a detector for detecting rotation of a motor and the threshold value inputted from the voltage generation circuit, and output a comparison result as a comparator output;
    an A/D converter configured to convert the analog signal into a digital signal;

a threshold value determination circuit configured to calculate an average value of a maximum value $V_{max}$ and a minimum value $V_{min}$ of the digital signal, as a new threshold value; and a resistance value change circuit configured to change a resistance value R of the variable resistor, such that the calculated new threshold value is inputted from the voltage generation circuit to the comparator.

2. The encoder according to claim 1, further comprising an amplification circuit configured to amplify an amplitude of the analog signal and outputting the amplified analog signal to the A/D converter.

3. An encoder comprising:

a voltage generation circuit connected to a power supply through a diode and having a variable resistor, the voltage generation circuit configured to output a voltage (I×R) corresponding to a current I flowing through the diode and a resistance value R of the variable resistor, as a threshold value $V_{th}$;

a plurality of comparators configured to perform comparisons between each of analog signals inputted from detectors for detecting rotation of motors and the threshold value inputted from the voltage generation circuit, and output comparison results as comparator outputs;

a plurality of A/D converters configured to convert the analog signals into digital signals;

a threshold value determination circuit for calculating a minimum value of average values each of which is calculated from a maximum value and a minimum value of each of the digital signals, as a new threshold value; and a resistance value change circuit configured to change a resistance value R of the variable resistor, such that the calculated new threshold value is inputted from the voltage generation circuit to the comparators.

4. The encoder according to claim 3, further comprising a plurality of amplification circuits configured to amplify amplitudes of the analog signals and output the amplified analog signals to the A/D converters.

5. A method for controlling an encoder comprising the steps of:

inputting an output voltage of a voltage generation circuit to a comparator, wherein the voltage generation circuit having a variable resistor is connected to a power supply through a diode and outputs the output voltage (I×R) corresponding to a current I flowing through the diode and a resistance value R of the variable resistor, as a threshold value $V_{th}$;

inputting an analog signal from a detector of the encoder to the comparator and an A/D converter;

converting the analog signal into a digital signal by the A/D converter;

performing a comparison between the analog signal and the threshold value, and outputting a comparison result as a comparator output by the comparator;

calculating an average value of a maximum value $V_{max}$ and a minimum value $V_{min}$ of the digital signal, as a new threshold value by a threshold value determination circuit; and changing a resistance value R of the variable resistor of the voltage generation circuit by a resistance value change circuit, such that the calculated new threshold value is inputted from the voltage generation circuit to the comparator.

6. The method according to claim 5, wherein the step of inputting the analog signal from the detector of the encoder to the A/D converter further includes the step of amplifying an amplitude of the analog signal by an amplification circuit.

7. A method for controlling an encoder comprising the steps of:

inputting an output voltage of a voltage generation circuit to a plurality of comparators, wherein the voltage generation circuit having a variable resistor is connected to a power supply through a diode and outputs the output voltage (I×R) corresponding to a current I flowing through the diode and a resistance value R of the variable resistor, as a threshold value $V_{th}$;

inputting analog signals from a plurality of detectors of the encoder to a plurality of comparators and a plurality of A/D converters;

converting the analog signals into digital signals by the A/D converters;

performing comparisons between each of the analog signals and the threshold value, and outputting comparison results as comparator outputs by the comparators;

calculating an average value of a maximum value $V_{max}$ and a minimum value $V_{min}$ of each of the digital signals as a new threshold value by a threshold value determination circuit; and changing a resistance value R of the variable resistor of the voltage generation circuit by a resistance value change circuit, such that the calculated new threshold value is inputted from the voltage generation circuit to the comparators.

8. The method according to claim 7, wherein the step of inputting the analog signals from the detectors of the encoder to the A/D converters further includes the step of amplifying amplitudes of the analog signals by a plurality of amplification circuits.

* * * * *